(12) United States Patent
Koellnberger et al.

(10) Patent No.: US 9,950,453 B2
(45) Date of Patent: *Apr. 24, 2018

(54) PRODUCTION OF THIN SILICONE FILMS

(71) Applicant: WACKER CHEMIE AG, Munich (DE)

(72) Inventors: Andreas Koellnberger, Kirchdorf (DE); Alfred Schwinghammer, Pfarrikirchen (DE)

(73) Assignee: WACKER CHEMIE AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/440,485

(22) Filed: Feb. 23, 2017

(65) Prior Publication Data

US 2017/0157807 A1 Jun. 8, 2017

Related U.S. Application Data

(63) Continuation of application No. 14/651,618, filed as application No. PCT/EP2013/073914 on Nov. 15, 2013, now abandoned.

(30) Foreign Application Priority Data

Dec. 12, 2012 (DE) .................. 10 2012 222 992

(51) Int. Cl.
| | | |
|---|---|---|
| *B05D 3/00* | (2006.01) |
| *B29C 41/28* | (2006.01) |
| *B29C 41/00* | (2006.01) |
| *C08J 5/18* | (2006.01) |
| *B29K 83/00* | (2006.01) |
| *B29L 7/00* | (2006.01) |

(52) U.S. Cl.
CPC ............ *B29C 41/28* (2013.01); *B29C 41/003* (2013.01); *C08J 5/18* (2013.01); *B29K 2083/00* (2013.01); *B29L 2007/008* (2013.01); *C08J 2383/04* (2013.01)

(58) Field of Classification Search
CPC ......... B29C 47/0021; C08J 5/18; B05D 3/007
See application file for complete search history.

(56) References Cited

U.S. PATENT DOCUMENTS

| | | |
|---|---|---|
| 3,819,772 A | 6/1974 | Kolobow |
| 2004/0070316 A1 | 4/2004 | Neubauer et al. |
| 2006/0096528 A1 | 5/2006 | Kawatake et al. |
| 2006/0127588 A1 | 6/2006 | Muller et al. |

(Continued)

FOREIGN PATENT DOCUMENTS

| | | |
|---|---|---|
| CN | 1756605 A | 4/2006 |
| DE | 2 045 558 | 3/1971 |

(Continued)

OTHER PUBLICATIONS

Shahrzad Jalali Mazlouman, et al. Mechanically Reconfigurable Antennas Using Electro-Active Polymers (EAPs), Antennas and Propagation (APSURSI), 2011, Ieee International Symposium on, IEEE, Jul. 3, 2011, pp. 742-745, XP032191527.

*Primary Examiner* — Nathan N Empie
(74) *Attorney, Agent, or Firm* — Brooks Kushman P.C.

(57) ABSTRACT

Thin silicon films of high thickness uniformity and thicknesses of from 0.1 μm to 200 μm are prepared by applying a crosslinkable silicone composition to a moving carrier by means of a slot die, removing solvent, if present, and subsequently crosslinking the silicone layer formed on the carrier.

20 Claims, 4 Drawing Sheets

(56) References Cited

U.S. PATENT DOCUMENTS

2010/0178824 A1    7/2010   Start et al.
2012/0187046 A1    7/2012   Boday et al.

FOREIGN PATENT DOCUMENTS

| | | |
|---|---|---|
| DE | 2 408 659 | 8/1974 |
| DE | 196 44 112 A1 | 5/1997 |
| DE | 10 2006 028 901 A1 | 12/2007 |
| EP | 0 097 313 A1 | 1/1984 |
| EP | 1 535 965 A1 | 6/2005 |
| EP | 1 661 686 A1 | 5/2006 |
| EP | 2 110 590 A1 | 10/2009 |
| GB | 1 330 124 | 9/1973 |
| JP | 11268100 A | 10/1999 |
| JP | 2001071338 A | 3/2001 |
| JP | 2008055256 A | 3/2008 |
| WO | 03/038221 A1 | 5/2003 |
| WO | 2004/078360 A1 | 9/2004 |

PRODUCTION OF THIN SILICONE FILMS

CROSS REFERENCE TO RELATED APPLICATIONS

This application is a continuation of U.S. application Ser. No. 14/651,618, filed Jun. 11, 2015 (pending), which is the U.S. National Phase of PCT Appln. No. PCT/EP2013/073914 filed Nov. 15, 2013, which claims priority to German Application No. 10 2012 222 992.2 filed Dec. 12, 2012, the disclosures of which are incorporated in their entirety by reference herein.

BACKGROUND OF THE INVENTION

1. Field of the Invention

The present invention relates to a method for the continuous production of thin silicone films, where the film thickness is between 0.1 and 200 µm and the thickness precision is ±5% measured over an area of 200 cm$^2$, and also to the silicone films produced by this method, and to their use.

2. Description of the Related Art

EP0097313A1 describes the production of a thin silicone elastomer film having a film thickness of one to 500 µm. For production, the film is applied to a coated paper, using a coating technique of rollercoating, air doctor or reverse roll coating, wire-wound bar coating, or spray coating in order to produce thin films. These techniques lead to silicone films having unsatisfactory thickness precision, and are therefore of only limited usefulness.

DE2408659 describes a method for producing thin, flawless silicone films, in which the silicone film is produced by casting a centrifuged silicone material to which solvent has been added. The costly and inconvenient method is unsuitable, however, for industrial production in a continuous process. Moreover, the thickness precisions achieved by means of the casting processes described are again insufficient.

EP1661686A2 describes the extrusion or coextrusion of a silicone layer. In terms of thickness precision, extrusion processes are unsuitable for layer thicknesses below about 200 µm, this constituting a substantial disadvantage of this technology. Through the use of a carrier material during the extrusion, moreover, the fluctuations in thickness of the carrier are transferred to the silicone film.

A continuous method for producing thin silicone films is described in DE2045558. The principal disadvantages of that method are that the doctor blade coating, on the one hand, requires high solvent content (ideally 60 wt % solvent is described) and, on the other hand, the accuracy of the layer thickness, analogously to extrusion methods, is dependent on the precision of the carrier used.

As the prior art shows, silicone films in a thickness range starting from about 200 µm and up to several mm can be produced by extrusion methods or molding methods. The respective methods here exhibit different disadvantages. In the case of discontinuous molding methods, a reduction in the layer thickness is accompanied by problems during automatic demolding, and, moreover, the production costs per square meter (sq. m.) of film are higher than in the case of continuously operating processes. Extrusion methods of HTV rubbers have the disadvantage of relatively large variations in thickness, and also of the limited possibility, owing to plant design and slot swelling, of reducing the layer thicknesses below 200 µm.

In addition to the absolute layer thickness, the uniformity of the layer thickness over the whole of the web produced is a critical factor for applications of the film as, for example, a dielectric or a membrane. The requirement of very uniform films having thicknesses of between one and about 250 µm exists in particular in the development of dielectric electroactive polymers (EAP for short), where the film is used as a dielectric. Applications of the electroactive polymers in actuators, sensors, or generators are based on the conversion of electrical energy into mechanical energy or of mechanical energy into electrical energy. Following application of an electrically conducting coating to one or both sides of the film, a deformation in the system as a whole is brought about, for example, by the application of electrical voltage (actuator principle).

SUMMARY OF THE INVENTION

An object of the invention, therefore, was to provide a continuous method for producing thin silicone films having a very thin and very uniform layer thickness, and also having high surface quality and high long-term load resistance. These and other objects were surprisingly achieved by the method of the invention for the continuous production of thin silicone films having a film thickness of 0.1 to 200 µm and a thickness precision of ±5% measured over an area of 200 cm$^2$, characterized in that i) a crosslinkable, solvent-containing or solvent-free silicone composition (X) is applied through the gap of a slot die to a moving carrier, ii) subsequently the solvent, if present, is removed from the silicone layer which forms on the carrier film, and the silicone layer is crosslinked, iii) after the crosslinking, the resulting silicone film can be parted from the carrier, with the following provisos:

the slot die in step i) is at an angle of between 10° and 90° to the carrier;

the travel speed of the carrier is between 0.1 and 1000 m/min;

the dynamic viscosity of the silicone composition (X) as measured according to DIN53019 is between 100 mPa·s and 100 Pa·s.

DETAILED DESCRIPTION OF THE PREFERRED EMBODIMENTS

Figure 1:
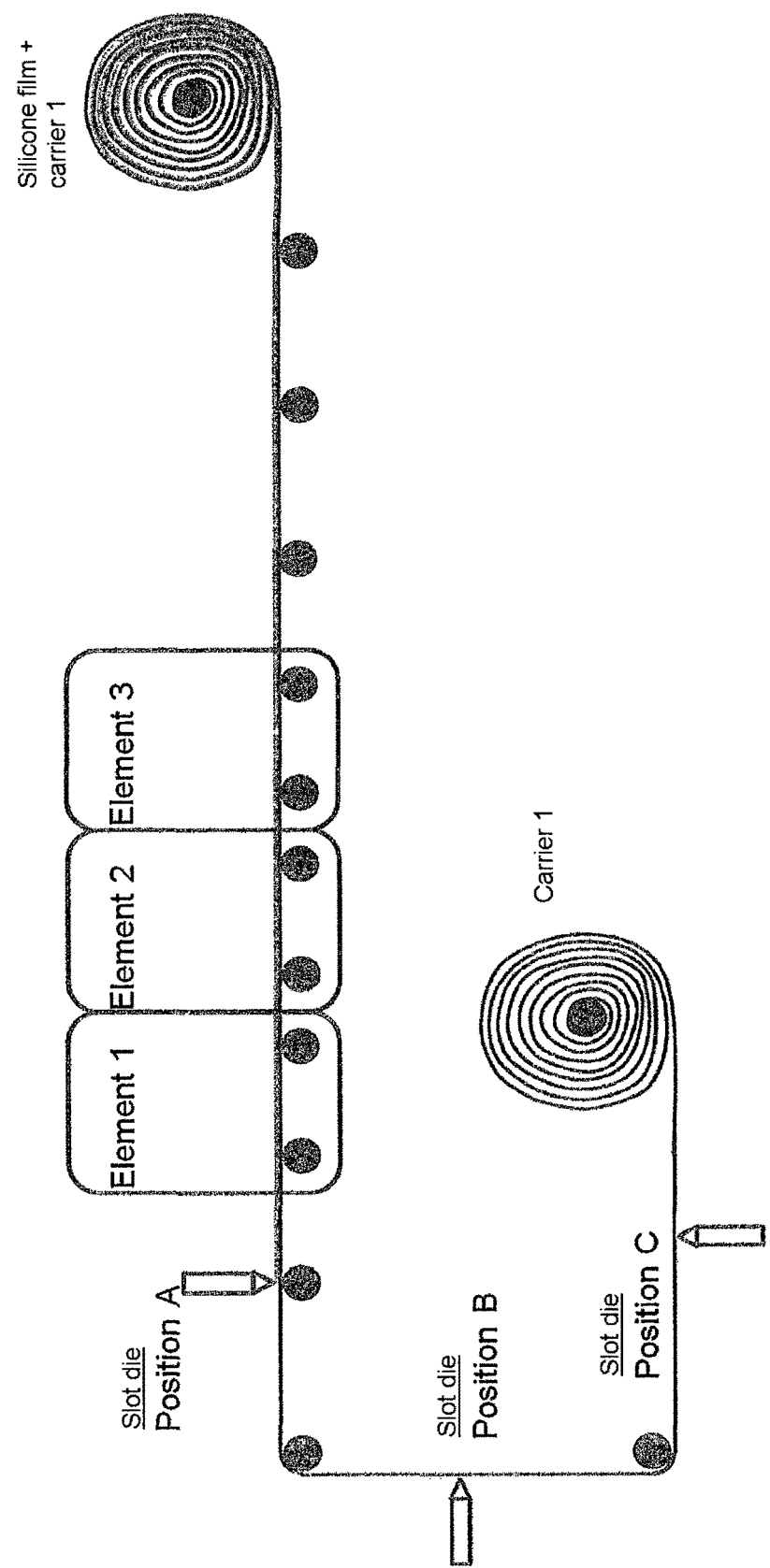
FIG. 1 illustrones one embodiment of a method according to the invention.

The preferred embodiments of individual features of the present invention, disclosed below at different places in the text, should be understood such that the combinations of these features in their preferred embodiments are also particularly preferred.

The method of the invention is carried out as far as possible in the absence of particles. Absence of particles means that during the overall process of film production, care must be taken to ensure that as few as possible of particles, whether in the form of active or inert fillers possibly incorporated by mixing, or in the form of extraneous particles, are included that are greater than about ⅓ of the desired layer thickness. For example, in a silicone film of the invention with a thickness of 24 µm, there are preferably no particles included with a diameter exceeding 8 µm. The removal of any particles present from the silicone composition (X) may take place in principle by all techniques known to the state of the art. Examples of such techniques are straining via strainer sieves (wire nets, wire braid), filter candles made of any of a very wide variety of materials (metal, plastic, ceramic, etc.), filtration techniques such as, for example, magnetic filtration, pressure filtration via filter presses, backflow filters, suction filters, etc., with or without filter aids such as activated carbon, metal oxides, etc. A further example of the removal of particles from the silicone composition (X) is centrifugation, and all of the methods stated or possible may take place in a batch process or continuously.

The method for producing the silicone film from the silicone composition (X) preferably takes place preferably under clean-room conditions, in which there are no particles larger than 5 µm. For the design of the production equipment, this means that the non-crosslinked silicone composition (X), following the removal of any particles present, is stored and processed only in clean rooms of class ISO 5 (ISO 1466-1) or better, preferably in clean rooms of class ISO 4 or better.

The carrier material used as carrier plays a minor role with regard to the production of the silicone film. Only the surface quality is critical, since elevations or depressions in the surface are taken on directly by the silicone composition (X). For this reason, carrier materials used are preferably those whose surfaces are particularly smooth and contain no depressions or elevations which are greater than 5%, preferably 3%, of the film thicknesses to be produced. Examples of carrier materials include: polyethylene, polypropylene, polyvinyl chloride, polystyrene, cellophane, polyesters (e.g. polyethylene terephthalate, polybutylene terephthalate, polycarbonate, polyethylene naphthalate), fluorine-containing polymers (e.g. polytetrafluoroethylene), metal strips or metal foils (as a continuous strip or via the feed rolls depicted; all metals are possible, with or without surface coating). The thickness of the carrier material used likewise plays only a minor part. Preferred thicknesses for polymeric carriers or metal foils are 10 µm to 200 µm, while those for metal strips are 200 µm to 2 mm. Preferred carrier materials are metal foils, metal strips, and polymeric films of polyethylene, polypropylene, polyethylene terephthalate, polybutylene terephthalate, and also polytetrafluoroethylene.

The travel speed of the carrier for the production of the silicone films is customarily between 0.1 and 1000 m/min, preferably between 0.5 and 500 m/min, and more preferably between 1 and 250 m/min. With the method of the invention it is possible to achieve web widths of between a few centimeters and several meters, with the preferred width being between 10 cm and 4 m, more preferably between 20 cm and 3 m.

As a result of the use of a slot die, the thickness of the silicone layer produced is dependent only on the flow rate of material, which is set via the supplying pump; on the web speed; and on the density of the crosslinkable silicone composition (X) used. The dynamic viscosity of the silicone composition (X) as measured according to DIN53019 is between 100 mPa·s and 100 Pa·s, preferably between 200 mPa·s and 75 Pa·s, and more preferably between 300 mPa·s and 50 Pa·s. Slot dies are known to the skilled person from the state of the art.

Described below are a number of embodiments of the method of the invention in exemplary form, using FIG. 1 to FIG. 4. These embodiments, however, should not be considered as exclusive for the design forms of the method of the invention.

In one simple embodiment, the silicone films of the invention are produced on a production line according to FIG. 1.

FIG. 1 serves for the simple illustration of the method of the invention. In the case of an arrangement as shown in FIG. 1, the silicone film is produced by the non-crosslinked silicone composition (X) being conveyed through the gap in the slot die in step i), with the feed rate and the speed of the carrier being adapted in such a way as to result in the desired layer thickness. The gap opening at the head of the slot die is customarily in the same width range as the layer to be produced, with marked differences also being possible (as is also evident from the later examples). The distance of the slot die from the carrier is somewhat above the desired layer thickness of the film. For a silicone film 50 µm thick, for example, the distance between the slot die and the carrier may vary between 55 µm and 500 µm preferably between 55 µm and 350 µm and more preferably between 55 µm and 200 µm.

The positioning of the slot die relative to the carrier may take place alternatively vertically from above (position A), horizontally (position B), or from below (position C). The angle between the slot die and the carrier material in FIG. 1 is 90°, but other angles are possible as described later on below. FIG. 1 depicts the elements 1 to 3 serving for step ii). The number of elements should be understood merely as an example and with no restriction on their number. Where silicone compositions (X) are used which contain no solvent, the use of a single element (for hot air, IR radiation, or UV radiation, for example) may be sufficient to bring about the crosslinking in step ii) to form the silicone film. In the case of silicone compositions (X) which include solvent, it is advantageous if the removal of the solvent and the step of crosslinking to give the silicone film are separated in process step ii), requiring at least two elements, element 1 and element 2. However, a plurality of elements in combinations may also be used for step ii). For example, in FIG. 1, element 1 serves to vent solvent, element 2 serves for crosslinking, and element 3 serves for aftertreating. When the silicone film has cured, it is collected or wound up together with the carrier in FIG. 1. Depending on the web speed and the onset temperature of the silicone composition (X), the lengths of the venting, crosslinking, and aftertreatment sections of the elements 1 to 3 may vary.

Figure 2:
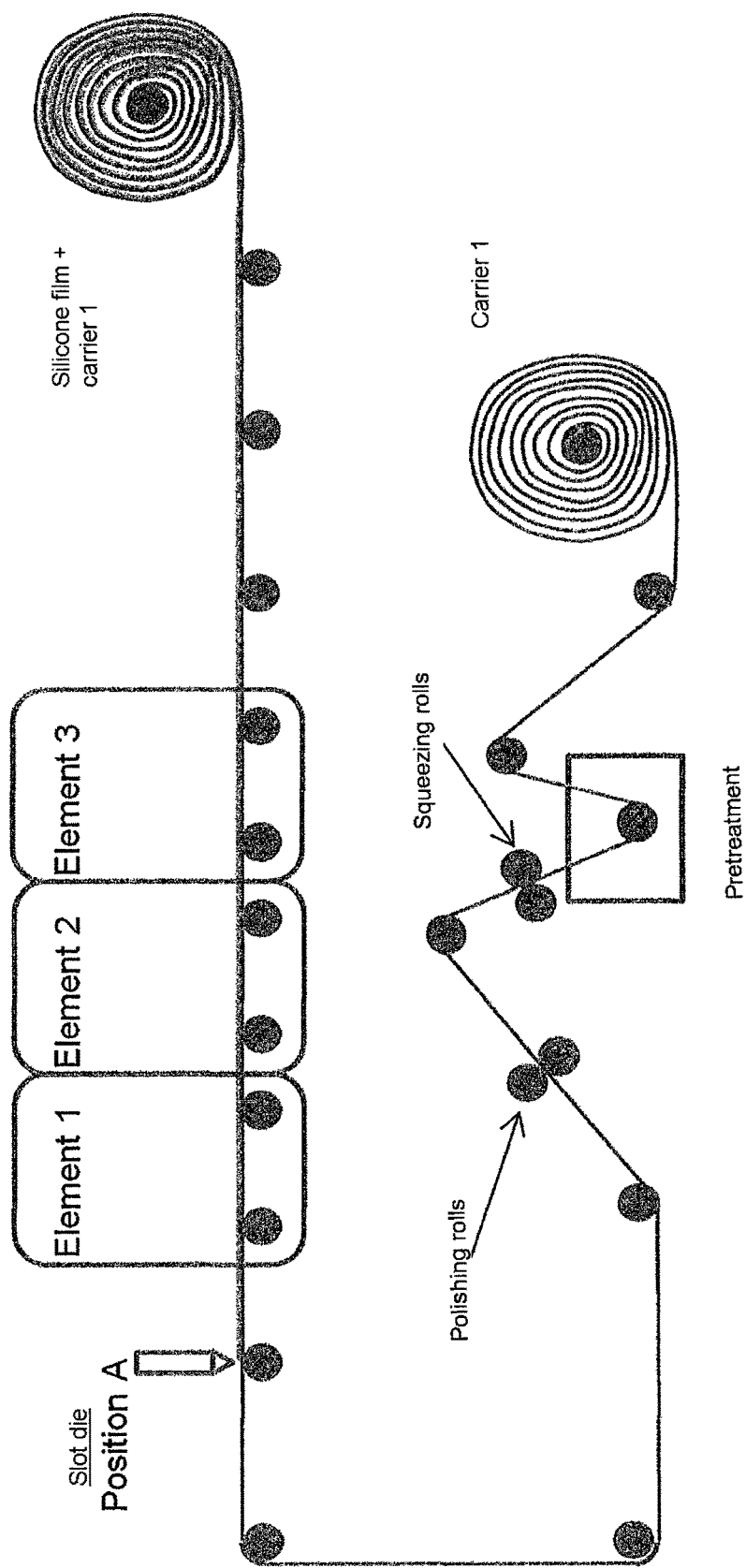
FIG. 2 illustrates a further embodiment of a method according to the invention.

In FIG. 2, production takes place in the same way as for FIG. 1, with the additional process step ia) of a pretreatment of the carrier. This is a dipping treatment of the carrier. After the dipping treatment, the carrier is passed through squeezing rolls and polishing rolls in order to remove excess pretreatment material.

Figure 3:
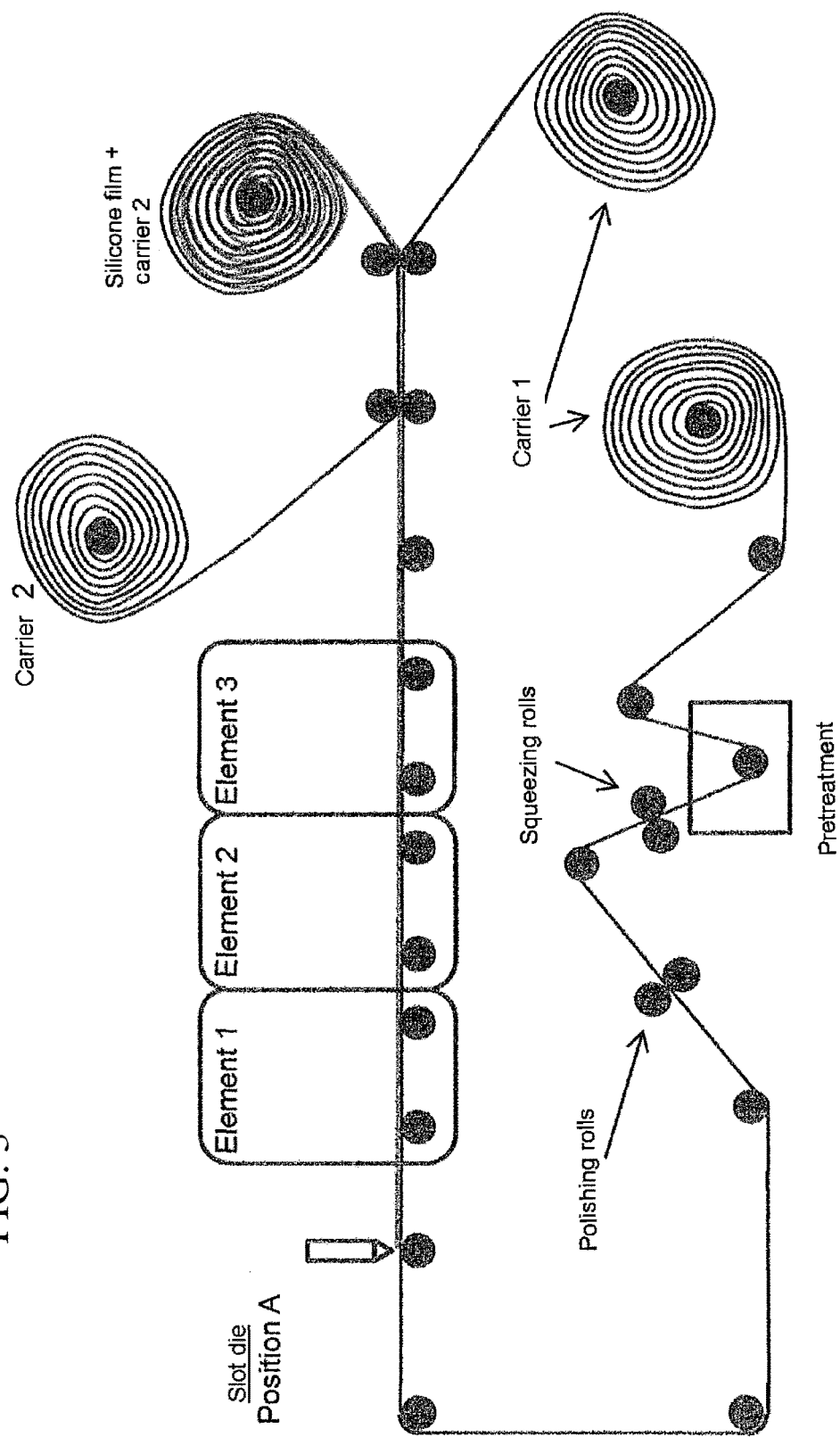
FIG. 3 illustrates a further embodiment of a method according to the invention.

In FIG. 3, production takes place in the same way as for FIG. 2, with the additional process step of the use of a second carrier, carrier 2, in step iii) after the crosslinking to give the silicone film. Here, the carrier 2 is applied to the surface of the silicone film and, with a slight offset (though it may also take place simultaneously), the silicone film is parted from carrier 1 and collected together with carrier 2.

Figure 4:
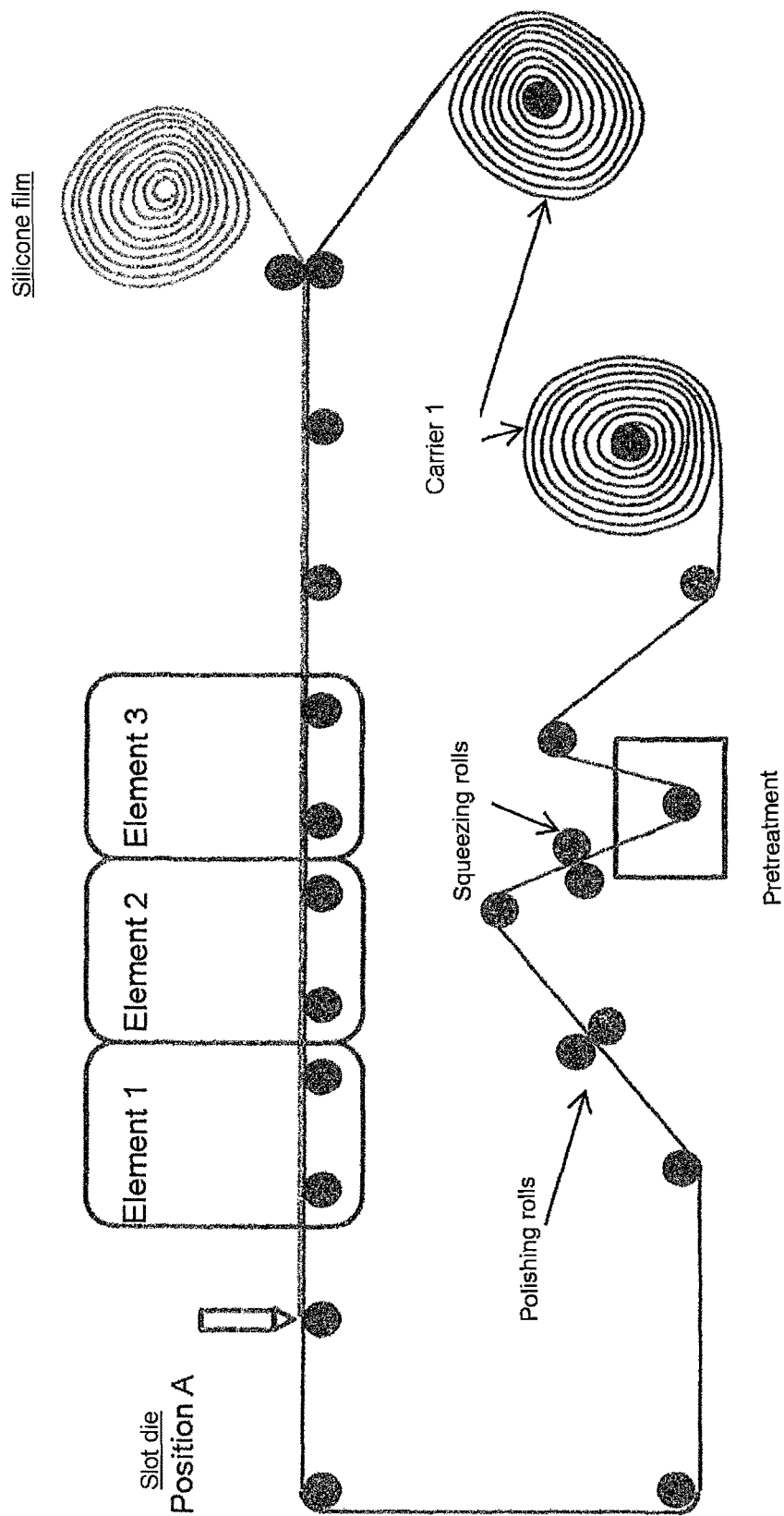
FIG. 4 illustrates a further embodiment of a method according to the invention.

In FIG. 4, production takes place in the same way as for FIG. 2, with the difference that the silicone film is parted from the carrier as step iii), directly after production in step ii), and is collected on its own.

As silicone compositions (X) it is possible in principle to use all of the silicones known to the state of the art. Addition-crosslinking, peroxidically crosslinking, condensation-crosslinking, or radiation-crosslinking compositions may be used. Preference is given to peroxidically or addition-crosslinking compositions. Particularly preferred are addition-crosslinking compositions.

Addition-crosslinking silicone compositions (X) used in accordance with the invention are known in the prior art and comprise, in a basic composition:
(A) at least one compound having radicals with aliphatic carbon-carbon multiple bonds,
(B) at least one organopolysiloxane having Si-bonded hydrogen atoms, or instead of (A) and (B)
(C) at least one organopolysiloxane having SiC-bonded radicals with aliphatic carbon-carbon multiple bonds, and having Si-bonded hydrogen atoms, and
(D) at least one hydrosilylation catalyst.

The addition-crosslinking silicone compositions (X) may be either one-component silicone compositions or two-component silicone compositions.

In the case of two-component silicone compositions, the two components of the addition-crosslinking silicone compositions (X) of the invention may comprise all constituents in any desired combinations, generally with the proviso that one component does not simultaneously comprise siloxanes with aliphatic multiple bond, siloxanes with Si-bonded hydrogen, and catalyst, in other words essentially does not simultaneously comprise constituents (A), (B), and (D), or (C) and (D).

The compounds (A) and (B) and, respectively, (C) that are used in the addition-crosslinking silicone compositions (X) of the invention are selected, as is known, such that crosslinking is possible. Thus, for example, compound (A) has at least two aliphatically unsaturated radicals, and (B) has at least three Si-bonded hydrogen atoms, or compound (A) has at least three aliphatically unsaturated radicals and siloxane (B) has at least two Si-bonded hydrogen atoms, or else siloxane (C) is used instead of compound (A) and (B), this siloxane (C) having aliphatically unsaturated radicals and Si-bonded hydrogen atoms in the proportions stated above. Also possible are mixtures of (A) and (B) and (C) having the above-designated proportions of aliphatically unsaturated radicals and Si-bonded hydrogen atoms.

The addition-crosslinking silicone composition (X) of the invention customarily contains 30-95 wt %, preferably 30-80 wt %, and more preferably 40-70 wt % of (A). The addition-crosslinking silicone composition (X) of the invention customarily contains 0.1-60 wt %, preferably 0.5-50 wt %, and more preferably 1-30 wt % of (B). If the addition-crosslinking silicone composition (X) of the invention comprises component (C), there is customarily 30-95 wt %, preferably 30-80 wt %, more preferably 40-70 wt % of (C) present in the formulation.

The compound (A) used in accordance with the invention may comprise silicon-free organic compounds preferably having at least two aliphatically unsaturated groups, and also organosilicon compounds preferably having at least two aliphatically unsaturated groups, or else mixtures thereof.

Examples of silicon-free organic compounds (A) are 1,3,5-trivinylcyclohexane, 2,3-dimethyl-1,3-butadiene, 7-methyl-3-methylene-1,6-octadiene, 2-methyl-1,3-butadiene, 1,5-hexadiene, 1,7-octadiene, 4,7-methylene-4,7,8,9-tetrahydroindene, methylcyclopentadiene, 5-vinyl-2-norbornene, bicyclo[2.2.1]hepta-2,5-diene, 1,3-diisopropenylbenzene, polybutadiene containing vinyl groups, 1,4-divinylcyclohexane, 1,3,5-triallylbenzene, 1,3,5-trivinylbenzene, 1,2,4-trivinylcyclohexane, 1,3,5-triisopropenylbenzene, 1,4-divinylbenzene, 3-methylhepta-1,5-diene, 3-phenylhexa-1,5-diene, 3-vinylhexa-1,5-diene, and 4,5-dimethyl-4,5-diethylocta-1,7-diene, N,N'-methylenebisacrylamide, 1,1,1-tris(hydroxymethyl)propane triacrylate, 1,1,1-tris(hydroxymethyl)propane trimethacrylate, tripropylene glycol diacrylate, diallyl ether, diallylamine, diallyl carbonate, N,N'-diallylurea, triallylamine, tris(2-methylallyl)amine, 2,4,6-triallyloxy-1,3,5-triazine, triallyl-s-triazine-2,4,6(1H,3H,5H)-trione, diallyl malonate, polyethylene glycol diacrylate, polyethylene glycol dimethacrylate, poly(propylene glycol) methacrylate.

As constituent (A), the addition-crosslinking silicone compositions (X) of the invention preferably comprise at least one aliphatically unsaturated organosilicon compound, in which case all aliphatically unsaturated organosilicon compounds used to date in addition-crosslinking compositions may be employed, such as, for example, silicone block copolymers having urea segments, silicone block copolymers having amide segments and/or imide segments and/or ester-amide segments and/or polystyrene segments and/or silarylene segments and/or carborane segments, and silicone graft copolymers having ether groups.

Organosilicon compounds (A) having SiC-bonded radicals with aliphatic carbon-carbon multiple bonds are preferably linear or branched organopolysiloxanes comprising units of the general formula (I)

$$R^4_a R^5_b SiO_{(4-a-b)/2} \tag{I}$$

where
$R^4$ independently at each occurrence, is an organic or inorganic radical free from aliphatic carbon-carbon multiple bonds,
$R^5$ independently at each occurrence, is a monovalent, substituted or unsubstituted, SiC-bonded hydrocarbon radical having at least one aliphatic carbon-carbon multiple bond,
a is 0, 1, 2, or 3, and
b is 0, 1, or b 2,
with the proviso that the sum a+b is less than or equal to 3 and there are at least 2 radicals $R^5$ per molecule.

Radical $R^4$ may comprise monovalent or polyvalent radicals, in which case the polyvalent radicals, such as divalent, trivalent, and tetravalent radicals, for example, join two or more, such as two, three, or four, for instance, siloxy units of the formula (I) to one another.

Further examples of $R^4$ are the monovalent radicals —F, —Cl, —Br, $OR^6$, —CN, —SCN, —NCO, and SiC-bonded, substituted or unsubstituted hydrocarbon radicals which may be interrupted by oxygen atoms or by the group —C(O)—, and also divalent radicals Si-bonded on both sides in accordance with formula (I). If radical $R^4$ comprises SiC-bonded, substituted hydrocarbon radicals, preferred substituents are halogen atoms, phosphorus-containing radicals, cyano radicals, —$OR^6$, —$NR^6$, —$NR^6_2$, —$NR^6$—C(O)—$NR^6_2$, —C(O)—$NR^6_2$, —C(O)$R^6$, —C(O)O$R^6$, —$SO_2$-Ph, and —$C_6F_5$. In that case $R^6$, independently at each occurrence, denotes a hydrogen atom or a monovalent hydrocarbon radical having 1 to 20 carbon atoms, and Ph is the phenyl radical.

Examples of radicals $R^4$ are alkyl radicals such as the methyl, ethyl, n-propyl, isopropyl, n-butyl, isobutyl, tert-butyl, n-pentyl, isopentyl, neopentyl, and tert-pentyl radicals, hexyl radicals such as the n-hexyl radical, heptyl radicals such as the n-heptyl radical, octyl radicals such as the n-octyl radical and isooctyl radicals such as the 2,2,4-trimethylpentyl radical, nonyl radicals such as the n-nonyl radical, decyl radicals such as the n-decyl radical, dodecyl radicals such as the n-dodecyl radical, and octadecyl radicals, such as the n-octadecyl radical; cycloalkyl radicals such as the cyclopentyl, cyclohexyl, cycloheptyl, and methylcyclohexyl radicals; aryl radicals such as the phenyl, naphthyl, anthryl, and phenanthryl radicals; alkaryl radicals such as the o-, m-, and p-tolyl radicals, xylyl radicals, and ethylphenyl radicals; and aralkyl radicals such as the benzyl radical, and the α- and the β-phenylethyl radicals.

Examples of substituted radicals $R^4$ are haloalkyl radicals such as the 3,3,3-trifluoro-n-propyl radical, the 2,2,2,2',2',2'-hexafluoroisopropyl radical, the heptafluoroisopropyl radicals, haloaryl radicals such as the o-, m-, and p-chlorophenyl radicals, $-(CH_2)-N(R^6)C(O)NR^6{}_2$, $-(CH_2)_o-C(O)NR^6{}_2$, $-(CH_2)_o-C(O)R^6$, $-(CH_2)_o-C(O)OR^6$, $-(CH_2)_o-C(O)NR^6{}_2$, $-(CH_2)-C(O)-(CH_2)_pC(O)CH_3$, $-(CH_2)-O-CO-R^6$, $-(CH_2)-NR^6-(CH_2)_p-NR^6{}_2$, $-(CH_2)_o-O-(CH_2)_pCH(OH)CH_2OH$, $-(CH_2)_o(OCH_2CH_2)_pOR^6$, $-(CH_2)_o-SO_2-Ph$, and $-(CH_2)_o-O-C_6F_5$, where $R^6$ and Ph correspond to the definition indicated therefor above, and o and p are identical or different integers between 0 and 10.

Examples of $R^4$ as divalent radicals Si-bonded on both sides in accordance with formula (I) are radicals which derive from the monovalent examples stated above for radical $R^4$ by virtue of an additional bond taking place through substitution of a hydrogen atom. Examples of such radicals are $-(CH_2)-$, $-CH(CH_3)-$, $-C(CH_3)_2-$, $-CH(CH_3)-CH_2-$, $-CH(Ph)-CH_2-$, $-C(CF_3)_2-$, $-(CH_2)_o-C_6H_4-(CH_2)_o-$, $-(CH_2)_o-C_6H_4-C_6H_4-(CH_2)_o-$, $-(CH_2O)_p$, $(CH_2CH_2O)_o$, and $-(CH_2)_o-O_x-C_6H_4-SO_2-C_6H_4-O_x-(CH_2)_o-$, where x is 0 or 1, and Ph, o, and p have the definitations stated above.

Preferably, radical $R^4$ comprises a monovalent, SiC-bonded, optionally substituted hydrocarbon radical which has 1 to 18 carbon atoms and is free from aliphatic carbon-carbon multiple bonds, more preferably a monovalent, SiC-bonded hydrocarbon radical which has 1 to 6 carbon atoms and is free from aliphatic carbon-carbon multiple bonds, and more particularly the methyl or phenyl radicals.

Radical $R^5$ may comprise any desired groups amenable to an addition reaction (hydrosilylation) with an SiH-functional compound.

If radical $R^5$ comprises SiC-bonded, substituted hydrocarbon radicals, preferred substituents are halogen atoms, cyano radicals, and $-OR^6$, where $R^6$ has the above-stated definition.

Preferably, radical $R^5$ comprises alkenyl and alkynyl groups having 2 to 16 carbon atoms, such as vinyl, allyl, methallyl, 1-propenyl, 5-hexenyl, ethynyl, butadienyl, hexadienyl, cyclopentenyl, cyclopentadienyl, cyclohexenyl, vinylcyclohexylethyl, divinylcyclohexylethyl, norbornenyl, vinylphenyl, and styryl radicals, with vinyl, allyl, and hexenyl radicals being particularly preferred.

The molecular weight of the constituent (A) may vary within wide limits, for instance between $10^2$ and $10^6$ g/mol. Hence, for example, constituent (A) may comprise a relatively low molecular mass, alkenyl-functional oligosiloxane, such as 1,2-divinyltetramethyldisiloxane, but may also be a high-polymer polydimethylsiloxane, for example with a molecular weight of $10^5$ g/mol (number average determined by means of NMR), that possesses in-chain or terminal Si-bonded vinyl groups. The structure of the molecules forming the constituent (A) is also not fixed; in particular, the structure of a siloxane of relatively high molecular mass, in other words an oligomeric or polymeric siloxane, may be linear, cyclic, branched, or else resinous, or network-like.

Linear and cyclic polysiloxanes are preferably composed of units of the formula $R^4{}_3SiO_{1/2}$, $R^5R^4{}_2SiO_{1/2}$, $R^5R^4SiO_{1/2}$, and $R^4{}_2SiO_{2/2}$, where $R^4$ and $R^5$ have the definition indicated above. Branched and network-like polysiloxanes additionally include trifunctional and/or tetrafunctional units, with preference being given to those of the formulae $R^4SiO_{3/2}$, $R^5SiO_{3/2}$, and $SiO_{4/2}$. It will be appreciated that mixtures of different siloxanes satisfying the criteria of constituent (A) may also be used.

Particularly preferred as component (A) is the use of vinyl-functional, substantially linear polydiorganosiloxanes having a viscosity of 0.01 to 500,000 Pa·s, more preferably 0.1 to 100,000 Pa·s, in each case at 25° C.

As organosilicon compound (B) it is possible to use all hydrogen-functional organosilicon compounds which are useful in addition-crosslinkable compositions.

Organopolysiloxanes (B) which have Si-bonded hydrogen atoms are preferably linear, cyclic, or branched organopolysiloxanes composed of units of the general formula (III)

$$R^4{}_cH_dSiO_{(4-c-d)/2} \qquad (III)$$

where
$R^4$ has the definition stated above,
c is 0, 1, 2, or 3, and
d is 0, 1, or 2,
with the proviso that the sum of c+d is less than or equal to 3 and there are at least two Si-bonded hydrogen atoms per molecule.

The organopolysiloxane (B) used in accordance with the invention preferably contains Si-bonded hydrogen in a range from 0.04 to 1.7 percent by weight (wt %), based on the total weight of the organopolysiloxane (B).

The molecular weight of the constituent (B) may likewise vary within wide limits, for instance between $10^2$ and $10^6$ g/mol. Thus constituent (B) may comprise, for example, an SiH-functional oligosiloxane of relatively low molecular mass, such as tetramethyldisiloxane, or alternatively may comprise a silicone resin having SiH groups or a high-polymer polydimethylsiloxane that possesses SiH groups within the chain or terminally.

The structure of the molecules that form the constituent (B) is also not fixed; in particular, the structure of an SiH-containing siloxane of relatively high molecular mass, in other words oligomeric or polymeric, may be linear, cyclic, branched, or else resinous, or network-like. Linear and cyclic polysiloxanes (B) are composed preferably of units of the formula $R^4{}_3SiO_{1/2}$, $HR^4{}_2SiO_{1/2}$, $HR^4SiO_{2/2}$, and $R^4{}_2SiO_{2/2}$, with $R^4$ having the definition indicated above. Branched and network-like polysiloxanes additionally include trifunctional and/or tetrafunctional units, with preference being given to those of the formulae $R^4SiO_{3/2}$, $HSiO_{3/2}$, and $SiO_{4/2}$, where $R^4$ has the definition indicated above.

It will be appreciated that mixtures of different siloxanes satisfying the criteria of constituent (B) may also be used. Particularly preferred is the use of low molecular mass, SiH-functional compounds such as tetrakis(dimethylsiloxy)silane and tetramethylcyclotetrasiloxane, and also of SiH-containing siloxanes of higher molecular mass, such as poly(hydrogenmethyl)siloxane and poly(dimethylhydrogenmethyl)siloxane with a viscosity at 25° C. of 10 to 20,000 mPa·s, or similar SiH-containing compounds in which some of the methyl groups have been replaced by 3,3,3-trifluoropropyl or phenyl groups.

The amount of constituent (B) in the crosslinkable silicone compositions (X) of the invention is preferably such that the molar ratio of SiH groups to aliphatically unsaturated groups in (A) is 0.1 to 20, more preferably between 0.3 and 2.0.

The components (A) and (B) used in accordance with the invention are commercial products and/or may be prepared by methods that are common within chemistry.

Instead of component (A) and (B), the silicone compositions of the invention may comprise organopolysiloxanes (C), simultaneously having aliphatic carbon-carbon multiple bonds and Si-bonded hydrogen atoms. The silicone compositions of the invention may also comprise all three components (A), (B), and (C).

If siloxanes (C) are used, these are preferably composed of units of the general formulae (IV), (V), and (VI)

  (IV)

  (V)

  (VI)

where $R^4$ and $R^5$ have the definition indicated for them above,
f is 0, 1, 2, or 3,
g is 0, 1, or 2, and
h is 0, 1, or 2,
with the proviso that per molecule there are at least 2 radicals $R^5$ and at least 2 Si-bonded hydrogen atoms.

Examples of organopolysiloxanes (C) are those comprising $SiO_{4/2}$, $R^4_3SiO_{1/2}$, $R^4_2R^5SiO_{1/2}$, and $R^4_2HSiO_{1/2}$ units, known as MP resins, and these resins may additionally contain $R^4SiO_{3/2}$ and $R^4_2SiO$ units, and also linear organopolysiloxanes substantially consisting of $R^4_2R^5SiO_{1/2}$, $R^4_2SiO$, and $R^4HSiO$ units, with $R^4$ and $R^5$ meeting the aforementioned definition.

The organopolysiloxanes (C) preferably possess an average viscosity of 0.01 to 500,000 Pa·s, more preferably 0.1 to 100,000 Pa·s, in each case at 25° C. Organopolysiloxanes (C) are preparable by techniques that are common within chemistry.

As hydrosilylation catalysts (D) it is possible to use all useful hydrosilylaion catalysts. Component (D) may be a platinum group metal, as for example platinum, rhodium, ruthenium, palladium, osmium, or iridium, or an organometallic compound thereof, or a combination thereof. Examples of component (D) are compounds such as hexachloroplatinic (IV) acid, platinum dichloride, platinum acetylacetonate, and complexes of these compounds encapsulated in a matrix or in a core/shell-like structure. The platinum complexes with low molecular weight of the organopolysiloxanes include 1,3-diethenyl-1,1,3,3-tetramethyldisiloxane complexes with platinum. Other examples are platinum-phosphite complexes or platinum-phosphine complexes. For photocuring or UV-curing compositions, for example, alkylplatinum complexes such as derivatives of cyclopentadienyltrimethylplatinum(IV), cyclooctadienyldimethylplatinum(II), or diketonato complexes, such as bisacetylacetonatoplatinum(II), for example, may be used in order to start the addition reaction by means of light. These compounds may be encapsulated within a resin matrix.

The concentration of component (D) for catalyzing the hydrosilylation reaction of components (A) and (B) and (C) on exposure is sufficient in order to generate the heat required here in the method described. The amount of component (D) may be between 0.1 and 1000 parts per million (ppm), 0.5 and 100 ppm, or 1 and 25 ppm of the platinum group metal, depending on the total weight of the components. The curing rate may be low if the constituent of the platinum group metal is below 1 ppm. The use of more than 100 ppm of the platinum group metal is uneconomical or lowers the storage stability of the silicone composition (X).

The addition-crosslinking silicone compositions (X) may optionally comprise all further additives which are useful for the production of addition-crosslinkable compositions. Examples of reinforcing fillers (F), which may be used as a component in the addition-crosslinking silicone compositions (X) of the invention, are fumed or precipitated silicas having BET surface areas of at least 50 m²/g, and also carbon blacks and activated carbons such as furnace black and acetylene black, with preference being given to fumed and precipitated silicas having BET surface areas of at least 50 m²/g. The stated silica fillers may have a hydrophilic character or may have been made hydrophobic by known methods. The amount of actively reinforcing filler in the crosslinkable silicone compositions (X) of the invention is within the range from 0 to 70 wt %, preferably 0 to 50 wt %.

With particular preference the crosslinkable, addition-crosslinking silicone compositions (X) are characterized in that the filler (E) is surface-treated. The surface treatment is obtained by the methods known in the state of the art for hydrophobizing finely divided fillers.

As a result of a surface treatment, preferred fillers (E) have a carbon content of at least 0.01 up to a maximum of 20 wt %, more preferably between 0.1 and 10 wt %, and most preferably between 0.5 to 5 wt %. Particular preference is given to those crosslinkable, addition-crosslinking silicone compositions (X) which are characterized in that the filler (E) is a surface-treated silica having 0.01 to 2 wt % of Si-bonded, aliphatically unsaturated groups. These groups are, for example, Si-bonded vinyl groups. In the addition-crosslinking silicone compositions (X) of the invention, the constituent (E) is preferably used as a single or likewise preferably as a mixture of two or more finely divided filler(s).

The addition-crosslinking silicone composition (X) of the invention may alternatively include as constituents further additives in a fraction of up to 70 wt %, preferably 0.0001 to 40 wt %. These additives may be, for example, inert fillers, resinous polyorganosiloxanes different from the siloxanes (A), (B), and (C), reinforcing and nonreinforcing fillers, fungicides, fragrances, rheological additives, corrosion inhibitors, oxidation inhibitors, light stabilizers, flame retardants, agents for influencing electrical properties, dispersing assistants, solvents, adhesion promoters, pigments, dyes, plasticizers, organic polymers, heat stabilizers, etc. These include additivies such as finely ground quartz, diatomaceous earth, clays, chalk, lithopone, carbon blacks, graphite, metal oxides, metal carbonates, metal sulfates, metal salts of carboxylic acids, metal dusts, fibers such as glass fibers and polymer fibers, polymer powders, metal dusts, etc.

The fillers, moreover, may be heat-conducting or electrically conducting. Examples of heat-conducting fillers are aluminum nitride; aluminum oxide; barium titanate; beryllium oxide; boron nitride; diamond; graphite; magnesium oxide; particulate metals such as copper, gold, nickel, or silver; silicon carbide; tungsten carbide; zinc oxide, and combinations thereof. Heat-conducting fillers are known in the state of the art and are available commercially. For example, CB-A20S and Al-43-Me are aluminum oxide fillers in different particle sizes, available commercially from Showa-Denko, and AA-04, AA-2, and AA18 are aluminum oxide fillers which are available commercially from Sumitomo Chemical Company. Silver fillers are available commercially from Metalor Technologies U.S.A. Corp. of Attleboro, Mass., U.S.A. Boron nitride fillers are available commercially from Advanced Ceramics Corporation, Cleveland, Ohio, U.S.A. The reinforcing fillers include silica and short fibers such as KEVLAR-Kurzfaser®, for example. A combination may be used of fillers with different particle sizes and different particle size distributions.

The addition-crosslinking silicone compositions (X) may comprise further optional components. The examples of further optional components include, among others, (F) one or more solvents, and (G) one or more inhibitors.

The addition-crosslinking silicone compositions (X) may additionally optionally comprise a solvent (F). It should be ensured, however, that the solvent (F) has no adverse effects on the system as a whole. Suitable solvents (F) are known in the state of the art and are available commercially. The solvent (F) may be, for example, an organic solvent having 3 to 20 carbon atoms. The examples of solvents (F) include aliphatic hydrocarbons such as nonane, decalin, and dodecane, for example; aromatic hydrocarbons such as mesitylene, xylene, and toluene, for example; esters such as ethyl acetate and butyrolactone, for example; ethers such as n-butyl ether and polyethylene glycol monomethyl ethers, for example; ketones such as, for example, methyl isobutyl ketone and methyl pentyl ketone; silicone fluids such as, for example, linear, branched, and cyclic polydimethylsiloxanes, and combinations of these solvents (F). The optimum concentration of a particular solvent (F) in the addition-crosslinking silicone composition (X) may be determined easily by means of routine experiments. Depending on the weight of the compound, the amount of the solvent (F) may be between 0 and 95 wt % or between 1 and 95 wt %.

The addition-crosslinking silicone composition (X) may additionally optionally comprise (G) inhibitors and stabilizers. Inhibitors and stabilizers (G) serve for the targeted setting of the processing life, onset temperature, and crosslinking rate of the addition-crosslinking silicone composition (X) of the invention. These inhibitors and stabilizers (G) are very well known within the field of addition-crosslinking compositions. Examples of commonplace inhibitors are acetylenic alcohols, such as 1-ethynyl-1-cyclohexanol, 2-methyl-3-butyn-2-ol, and 3,5-dimethyl-1-hexyn-3-ol, 3-methyl-1-dodecyn-3-ol, polymethylvinylcyclosiloxanes such as 1,3,5,7-tetravinyltetramethyltetracyclosiloxane, low molecular mass silicone oils with methylvinyl-$SiO_{1/2}$ groups and/or $R_2vinylSiO_{1/2}$ end groups, such as divinyltetramethyldisiloxane, tetravinyldimethyldisiloxane, trialkyl cyanurates, alkyl maleates, such as diallyl maleates, dimethyl maleate, and diethyl maleate, alkyl fumarates, such as diallyl fumarate and diethyl fumarate, organic hydroperoxides such as cumene hydroperoxide, tert-butyl hydroperoxide, and pinane hydroperoxide, organic peroxides, organic sulfoxides, organic amines, diamines and amides, phosphanes and phosphites, nitriles, triazoles, diaziridines, and oximes. The activity of these inhibitor additives (G) is dependent on their chemical structure, and so the concentration must be determined individually. Inhibitors and inhibitor mixtures (G) are added preferably in a quantitative fraction of 0.00001 wt % to 5 wt %, based on the total weight of the mixture, preferably 0.00005 to 2 wt %, and more preferably 0.0001 to 1 wt %.

The following enumeration stands by way of example for silicone compositions (X) which are available commercially on the market and which are suitable for the production of thin layers by the method of the invention. Mostly they are addition-crosslinking silicone compositions (X). Depending on the viscosity of the commercial silicone compositions (X), solvent (F) may be added for better processing properties.

Materials from WACKER Chemie AG, Munich: ELASTOSIL® P series (7010, 7600, 7613, 7161-160, 7616-195, 7618, 7619, 7622, 7623, 7624, 7628, 7629, 7630, 7633, 7636, 7642-220, 7670, 671, 7676, 7682, 7683/15, 7683/25, 7683/47, 7683/50, 7683/55, 7684/60, 7685, 7686, 7687, 7688, 7700, 7710, 7720, 7731, 7742, 7770, 7707 US, 7915, . . . ), ELASTOSIL® M series (4115, 4125, 4370, 4400, 4440, 4441, 4470, 4600, 4601, 4615, 4630, 4635, 4640, 4645, 4641, 4643, 4644, 4670, 4647, 4648, 4670), ELASTOSIL® RT series (601, 602, 604, 607, 615, 617, 619, 620, 622, 623, 624, 625, 626, 627, 628, 629, 630, 633, 646, 670, 672, 675, 678, 685, . . . ), ELASTOSIL® SOLAR series (2000, 2200, 2202, 3210, . . . ), LSR: ELASTOSIL® LR series (3003/03, 3003/05, 3003/10, 3003/20, 3070/20, 3844/20, 3846/20, 3856/20, 3003/30, 3004/30, 3005/30, 3040/30, 3044/30, 3065/30, 3070/30, 3071/30, 3072/30, 3843/30, 3844/30, 3846/30, 3856/30, 3003/40, 3003/50, 3003/60, 3003/70, 3003/80, 3003/85, 3004/40, 3004/50, 3004/60, 3004/70, 3005/40, 3005/50, 3005/60, 3040/40, 3040/50, 3040/60, 3043/40, 3043/50, 3043/60, 3043/70, 3015/70, 3023/60, 3092/65, 3094/60, 3065/50, 3066/40, 3066/60, 3066/80, 3070/40, 3070/50, 3070/60, 3071/40, 3071/50, 3071/60, 3072/40, 3074/60, 3076/70, 3170/40, 3841/50, 3842/40, 3842/50, 3842/60, 3842/70, 3162, . . . ), ELASTOSIL® FLR series (3900/40, 3900/60, 3905/40, 3905/60, . . . ), HTV: ELASTOSIL® R series, WACKER SILGEL® series (610, 611, 612, 613, 616, 619, . . . ), SEMICOSIL® series, POWERSIL® series, LUMISIL® series, GENIOMER® series, SILPURAN® series, DEHESIVE® series.

Sometimes a pretreatment of the carrier is an advantage as an additional process step ia).

Where such pretreatment takes place, this step ia) may take place, for example, via a dip treatment of the carrier. Other chemical or physical pretreatment techniques are likewise possible, with examples thereof being as follows: spray treatment, cleaning methods, degreasing methods, plasma treatment, or the deposition of layers (e.g.: fluorocarbon layers). Whether a pretreatment step ia) is necessary or useful depends on the carrier material used. If excessive chemical or physical attachment of the silicone elastomer to the carrier material results in the film being unable to be detached from the carrier after crosslinking, this can be prevented by a pretreatment of the carrier. In order to facilitate the parting of the silicone film from the carrier, the carrier is preferably treated with a release agent, in which case all of the release agents known to the state of the art may be used, such as the following, for example: detergents such as nonionic surfactants (polyalkylene glycol ethers, alkylglucosides, fatty alcohol propylates, alkylpolyglucosides, octylphenol ethoxylates, nonylphenol ethoxylates), anionic surfactants (alkyl carboxylates, alkylbenzenesulfonates, fatty alcohol sulfates), cationic surfactants (mostly quaternary ammonium compounds such as tetraalkylammonium halides or ester quats), or amphoteric surfactants (betaines, sulfobetaines). All commercial surfactants or surfactant mixtures may be used for a pretreatment, such as, for example, the Surfynol® series, the Dynol™ series, the EnviroGem® series, the Leunapon F series, the Leunapon FU series, the Leunapon P series, the Metaupon series, the Hansanol AS 240 series, the Hansanol NS-242 series, the Hansanol NS 243 series, the Hansanol NS 252 series, the Hansanol NS-262 series, the Hansanyl OS series, the Hansanid CFAD, the Hansanolat FA series, the Hansanolat NP series, the Hansateric CAPB series, the Cremophor® series, the Eusapon® series, the Jordapon® series, the AVANEL series, the Lutensit® series, the Lutensol series, the Pluracare® series, the Plurafac® series, or the Pluronic series.

The release agent or a mixture of different release agents and additives is used preferably in an aqueous, alcoholic, or aqueous-alcoholic mixture, with preferred alcohol components used being linear and branched aliphatic alcohols such as, for example, methanol, ethanol, propanol, butanol, pentanol, hexanol, heptanol, octanol, isopropanol, isobutanol, etc.

Prior to the application of the silicone composition (X) to the carrier it is preferred for the excess pretreatment material to be removed from the carrier again, which is preferably accomplished with the aid of squeezing and/or polishing rolls and/or polishing plates. Arrangement, size, speed, or number of the assemblies play only a minor part. Preference, moreover, is given to the use of at least one polishing roll or polishing plate, particular preference to the use of a combination of squeezing rolls and polishing rolls.

The slot die in step i) is at an angle of between 10° and 90° relative to the carrier. Preferred angles are between 30° and 90°, and particularly preferred angles are between 50° and 90°.

In one preferred embodiment, the distance of the slot die from the carrier in step i) is at least 2 µm, preferably at least 5 µm greater than the layer thickness of the silicone film produced.

The mode of operation of the slot die is unimportant for the layer thickness calculations, since it represents a premetered method (bead mode, curtain mode, short curtain mode). Where necessary, a subatmospheric pressure may be applied to the slot die in order to achieve the mode at the stated speed. The mass flow rate of the silicone composition (X) is regulated and adjusted via suitable pumps, such as, for example, gear pumps, piston pumps, membrane pumps, etc.

Activation for the crosslinking in step ii) may take place thermally, via IR radiation, or via UV radiation. In the case of room-temperature-vulcanizing (i.e., RTV crosslinking) systems, room temperature is sufficient for curing, and so there need be no additional supply of energy. Microwave activation or activation by ultrasound is also possible.

In the case of UV-crosslinking systems, the catalyst (D) of the hydrosilylation reaction of the addition-crosslinking silicone composition (X) is activated by irradiation in order to achieve crosslinking. All of the light sources known to the state of the art may be used, such as LEDs, mercury vapor lamps, doped mercury vapor lamps, xenon lamps, or lasers, for example. Wavelengths irradiated with preference are between 250 and 800 nm, particular preference being given to wavelengths of between 300 and 500 nm. The arrangement of the light sources is arbitrary, and the distance between the light source and the silicone composition (X) for crosslinking may vary between a few millimeters and several centimeters.

In the simplest case, the silicone film formed in step ii) is collected directly with the carrier. Further possibilities include parting the silicone film from the carrier in a step iii) and then collecting it, or transferring it from the carrier to a second carrier and then collecting it together with the second carrier.

Reasons for the necessity of transfer to another carrier may be, for example, the deficient thermal or UV stability of the carrier, price differences between the carrier materials, surface properties, surface qualities, thickness, weight, etc. The step of carrier changeover has no influence at all on the other process steps.

Subsequently, the silicone film thus collected may either be further-processed directly or stored pending further use. If the carrier is removed from the silicone film only as part of further processing, the point in time (whether before or after further processing) may play a part. Further processing of the film may take place with all of the methods known to the state of the art, for the shaping of the silicone film, for example, in order to be able to use it in the desired application. Examples thereof, without restricting the invention, are cutting with diverse techniques such as knife, laser, water or particle jet, or punching. Also possible is fixing by means, for example, of adhesive bonding, etc.

A further subject of the present invention are silicone films produced by the method of the invention, having a film thickness of 0.1 to 200 preferably of 1 to 150 µm, and more preferably of 2 to 100 µm, and in each case with a thickness precision of ±5% measured over an area of 200 $cm^2$; preferably a thickness precision of in each case ±3%.

The silicone films produced by the method of the invention described have the advantage, furthermore, that they can be used as dielectric electroactive polymers (EAP) in actuators, sensors, or generators, since their breakdown voltage is greater than 25 kV/mm, preferably greater than 30 kV/mm, and more preferably greater than 35 kV/mm.

In applications of EAPs in the area of actuators or of generators, in particular, several million oscillation cycles will be traversed in the course of the lifetime. One advantage of the silicone films produced by means of the method of the invention is a very high long-term load resistance, resulting from the uniformity of and absence of particles from the silicone film. For designing the operating voltage of the components, the properties specified above are likewise of utmost importance, since they possess a direct influence over the breakdown field strength. The maximum electrical field in turn has a direct influence on the efficiency and the performance of the actuators or generators.

Uniformity means that the layer thickness over a particular area is subject to only minimal variation. In the case of silicone films produced with the method of the invention, the layer thickness varies at maximum by ±5% within an area of 200 $cm^2$(=thickness precision). This would mean that, for example, a film having an average layer thickness of 100 µm, over an area of 200 $cm^2$, has no point at which the layer thickness is less than 95 µm or greater than 105 µm. Or, put alternatively, a film having an average layer thickness of 100 µm and a thickness precision of ±5% always has a thickness of at least 95 and not more than 105 µm over the entire area of 200 $cm^2$, irrespective of where on the 200 $cm^2$ area the layer thickness is determined.

The method described can be used to construct not only silicone films but also multilayer structures where at least one layer represents a silicone film of the invention.

Depending on application, a multiplicity of arrangements or constructions is conceivable for such systems, and can be achieved through stacking, folding, rolling, etc.

Further applications of the films produced by the method claimed are as follows: barrier films in the medical or food sector, insulating tapes, protective films (keyboards, skin protection, oral protection, glass/scratch protection for diverse materials), packaging of all kinds (foods, plants), backing films for wound contact materials, functional layers in clothing, layer for substance separation or gas separation (gas separation, seawater desalination, etc.), backing film, cooking film, films for display applications, airbags, or wine corks.

EXAMPLES

In the examples described below, all figures are in parts and percentages by weight unless otherwise indicated.

Unless otherwise indicated, the examples below are carried out under a pressure of the surrounding atmosphere, in other words approximately at 1000 hPa, and at room temperature, in other words at 25° C., or at a temperature which comes about when the reactants are combined at room temperature without additional heating or cooling. All viscosity figures hereinafter relate to a temperature of 25° C. The examples below illustrate the invention, without having any restrictive effect.

The carrier used in the examples was a PET (polyethylene terephthalate) film from Mitsubishi Polymer Film GmbH (HOSTAPHAN®). Films of this kind are also available from other manufacturers; for example, MYLAR® (DuPont Teijin Films), MELINEX® (DuPont Teijin Films), SCOTCHPAK® (3M Company, St. Paul, Minn.).

A slot die from COATEMA Coating Machinery GmbH was used, the nature of this slot die having no critical part as far as production is concerned. Alternatively, slot dies from other manufacturers (FMP Technology GmbH, Mitsubishi Heavy Industries, etc.) can also be used.

The absolute layer thickness is determined by means of an SEM analysis of a cryosection; the surface quality and roughness are determined by means of the Leica DCM 3D confocal microscope.

Abbreviations used are as follows:
Ex. Example
No. Number
PDMS Polydimethylsiloxane
LSR Liquid Silicone Rubber
HTV High-temperature vulcanizing (crosslinking)
wt % Weight percent, w/w
$U_w$ Substrate or web speed
ρ Density
h Wet film thickness
B Coating width Examples 1 to 5 were carried out by a method according to FIG. 1, with position A of the slot die being selected. In example 6 (comparative example, not inventive), the silicone composition was applied by means of a four-way bar applicator. Examples 7 to 10 were carried out by a method according to FIG. 3, with position A of the slot die being selected.

Example 1: (without Pretreatment)

Production of a 50 μm film from the RTV-2 material ELASTOSIL® P 7670 AB (mixing ratio A:B=1:1, density according to ISO 2811=1.03 g/cm$^3$, Shore A hardness according to ISO 868=7, elongation at break according to ISO 37=600%, tensile strength according to ISO 37=1.8 N/mm$^2$, viscosity after mixing the components according to ISO 3219=1800 mPa·s with shearing of 1 s$^{-1}$, tear strength according to ASTM D 624 B=2.1 N/mm).

In order to establish a wet film thickness of 50 μm at a web speed of 1 m/min with a layer width of 0.3 m at the density given, the feed rate is 15.45 ml/min.
Measured layer thickness/surface roughness: 50±1.5 μm
Breakdown voltage according to ASTM D 3755: 35 kV/mm Example 2: (without Pretreatment)

Production of a 20 μm film from the RTV-2 material ELASTOSIL® P 7684/60 AB (mixing ratio A:B=1:1, density according to ISO 2811=1.08 g/cm$^3$, Shore A hardness according to ISO 868=12, elongation at break according to ISO 37=600%, tensile strength according to ISO 37=3 N/mm$^2$, viscosity after mixing the components according to ISO 3219=1500 mPa·s with shearing of 1 s$^{-1}$, tear strength according to ASTM D 624 B=13 N/mm).

In order to establish a wet film thickness of 20 μm at a web speed of 2 m/min with a layer width of 0.3 m at the density given, the feed rate is 32.4 ml/min.
Measured layer thickness/surface roughness: 20±1 μm
Breakdown voltage according to ASTM D 3755: 50 kV/mm Example 3: (without Pretreatment)

Production of a 100 μm film from the RTV-2 material ELASTOSIL® LR 3003/40, diluted, after or before the mixing of the component, to a solvent fraction of 50 vol % (alkane fraction, tradename ISOPAR-E), (mixing ratio A:B=1:1, density according to ISO 2811=1.0 g/cm$^3$, Shore A hardness according to ISO 868=42, elongation at break according to ISO 37=610%, tensile strength according to ISO 37=10 N/mm$^2$, tear strength according to ASTM D 624 B=33 N/mm, viscosity after mixing of the components according to ISO 3219=5300 mPa·s with shearing of 1 s$^{-1}$).

A layer thickness of the elastomer of 100 μm at 50 vol % solvent fraction and a wet film thickness of 200 μm with a web speed of 5 m/min and a layer width of 0.3 m at the given density requires a feed rate of 300 ml/min. The solvent is removed by evaporation prior to crosslinking. The detailed procedure for this process is unimportant with regard to the film to be produced. In this example, the web is run through a drying oven 3 m long and with three different temperature zones (first meter=120° C., second meter=140° C., third meter=165° C.) in order first to evaporate off the solvent and thereafter to bring about crosslinking of the material through the elevated temperature.
Measured layer thickness/surface roughness: 100±3 μm
Breakdown voltage according to ASTM D 3755: 40 kV/mm Example 4: (without Pretreatment)

The material from example 3 was run with a web speed of 30 m/min and, accordingly, with a feed rate of 1800 ml/min.
Measured layer thickness/surface roughness: 100±4 μm
Breakdown voltage according to ASTM D 3755: 40 kV/mm Example 5: (without Pretreatment)

Production of a 20 μm film of a silicone having the following composition:

49 wt % of a vinyl-terminated, linear polydimethylsiloxane having an average chain length of approximately 220.

23 wt % of an Me$_2$Si—H-terminated, linear polydimethylsiloxane having an average chain length of approximately 220.

23 wt % of a hydrophobized, fumed silica having a BET surface area of 130 m$^2$/g 5 wt % of a linear comb crosslinker having a chain length of approximately 220 units and an Si—H content of 0.15 wt %

The mixture further comprises
10 ppm of platinum catalyst (divinyltetramethyldisiloxane complexes, based on the metal) 250 ppm of 1-ethynylcyclohexanol for setting the pot life.

Shore A hardness according to ISO 868=26, density according to ISO 2811=1.05 g/cm$^3$, elongation at break according to ISO 37=490%, tensile strength according to ISO 37=5.9 N/mm$^2$, tear strength according to ASTM D 624 B=11.6 N/mm, viscosity according to ISO 3219=6900 mPa·s with shearing of 1 s$^{-1}$.

In order to set a wet film thickness of 20 μm with a web speed of 10 m/min and a layer width of 0.3 m at the density given, the feed rate is 63 ml/min.
Measured layer thickness/surface roughness: 20±0.8 μm
Breakdown voltage according to ASTM D 3755: >75 kV/mm Example 6: (Comparative Example, not Inventive)

Production of a 50 μm film from the RTV-2 material ELASTOSIL® P 7670 A/B (mixing ratio A:B=1:1, density according to ISO 2811=1.03 g/cm$^3$, Shore A hardness according to ISO 868=7, elongation at break according to ISO 37=600%, tensile strength according to ISO 37=1.8 N/mm$^2$, viscosity after mixing the components according to ISO 3219=1800 mPa·s with shearing of 1 s$^{-1}$, tear strength according to ASTM D 624 B=2.1 N/mm).
The adjustment of the layer thickness to 50 μm is accomplished by manually adapting the distance between the four-way bar applicator used and the web.
Measured layer thickness/surface roughness: 50±6 μm
Breakdown voltage according to ASTM D 3755: 22 kV/mm Example 7: (with Pretreatment)

The dipping bath in FIG. 3 is used, with a solution of 2 wt % of the commercial surfactant mixture Green Care No. 5 from Tana Chemie GmbH in water. The rotary speed of the squeezing rolls is the same as the web speed; that of the polishing rolls is five times the web speed.
Production of a 50 μm film from the RTV-2 material ELASTOSIL® P 7670 A/B (mixing ratio A:B=1:1, density according to ISO 2811=1.03 g/cm$^3$, Shore A hardness according to ISO 868=7, elongation at break according to ISO 37=600%, tensile strength according to ISO 37=1.8 N/mm$^2$, viscosity after mixing the components according to ISO 3219=1800 mPa·s with shearing of 1 s$^{-1}$, tear strength according to ASTM D 624 B=2.1 N/mm).
In order to establish a wet film thickness of 50 μm at a web speed of 1 m/min with a layer width of 0.3 m at the density given, the feed rate is 15.45 ml/min.
Measured layer thickness/surface roughness: 50±1.5 μm
Breakdown voltage according to ASTM D 3755: 35 kV/mm Example 8: (with Pretreatment)

The dipping bath in FIG. 3 is used, with a solution of 2 wt % of the commercial surfactant mixture Green Care No. 5 from Tana Chemie GmbH in water. The rotary speed of the squeezing rolls is the same as the web speed; that of the polishing rolls is five times the web speed.
Production of a 20 μm film of a silicone having the following composition:
35 wt % of a vinyl-terminated, linear polydimethylsiloxane having an average chain length of approximately 600.
15 wt % of a vinyl-terminated, linear polydimethylsiloxane having an average chain length of approximately 220.
50 wt % of a linear comb crosslinker, Me$_2$SiH-terminated, having a chain length of approximately 220 units and an Si—H content of 0.015 wt %.
The mixture further comprises
10 ppm of platinum catalyst (divinyltetramethyldisiloxane complexes, based on the metal)
250 ppm of 1-ethynylcyclohexanol for setting the pot life.
Shore A hardness according to ISO 868=2, density according to ISO 2811=0.97 g/cm$^3$, elongation at break according to ISO 37=350%, tensile strength according to ISO 37=1.9 N/mm$^2$, tear strength according to ASTM D 624 B=2.6 N/mm, viscosity according to ISO 3219=3500 mPa·s with shearing of 1 s$^{-1}$.
In order to set a wet film thickness of 20 μm with a web speed of 10 m/min and a layer width of 0.3 m at the density given, the feed rate is 64.02 ml/min.
Measured layer thickness/surface roughness: 20±1 μm
Breakdown voltage according to ASTM D 3755: 35 kV/mm Example 9: (with Pretreatment)

The dipping bath in FIG. 3 is used, with a solution of 2 wt % of the commercial surfactant mixture Green Care No. 5 from Tana Chemie GmbH in water. The rotary speed of the squeezing rolls is the same as the web speed; that of the polishing rolls is five times the web speed.
Production of a 0.5 μm film of a silicone having the following composition:
49 wt % of a vinyl-terminated, linear polydimethylsiloxane having an average chain length of approximately 220.
23 wt % of an Me$_2$Si—H-terminated, linear polydimethylsiloxane having an average chain length of approximately 220.
23 wt % of a hydrophobized, fumed silica having a BET surface area of 130 m$^2$/g
5 wt % of a linear comb crosslinker having a chain length of approximately 220 units and an Si—H content of 0.15 wt %
The mixture further comprises
10 ppm of platinum catalyst (divinyltetramethyldisiloxane complexes, based on the metal)
250 ppm of 1-ethynylcyclohexanol for setting the pot life.
Prior to the application, 1 l of mixture is diluted with 3 l of solvent (alkane fraction, tradename Isopar E); the density of the solution is 0.98 g/cm$^3$, the viscosity of the solution according to ISO 3219=30 mPa·s with shearing of 1 s$^{-1}$.
Shore A hardness according to ISO 868=26, elastomer density according to ISO 2811=1.05 g/cm$^3$, elongation at break according to ISO 37=490%, tensile strength according to ISO 37=5.9 N/mm$^2$, tear strength according to ASTM D 624 B=11.6 N/mm, viscosity according to ISO 3219=6900 mPa·s with shearing of 1 s$^{-1}$.
In order to set a wet film thickness of 2 μm with a web speed of 1 m/min and a layer width of 0.3 m at the density given, the feed rate is 0.588 ml/min.
Measured layer thickness/surface roughness: 0.5±0.02 μm
Breakdown voltage according to ASTM D 3755: 85 kV/mm.

What is claimed is:
1. A method for the continuous production of a thin silicone film having a film thickness of 0.1 to 200 μm and a thickness precision of not more than ±5% measured over an entire area of 200 cm$^2$, comprising:
   i) applying a crosslinkable, solvent-containing or solvent-free silicone composition (X) through the gap of a slot die onto a moving carrier,
   ii) subsequently removing solvent, if present, from a silicone layer which forms on the carrier, and crosslinking the silicone layer,
   iii) wherein after crosslinking, the resulting crosslinked silicone film is partable from the carrier, and
      a) the slot die in step i) is at an angle of between 10° and 90° to the carrier;
      b) the travel speed of the carrier is between 0.1 and 500 m/min; and
      c) the dynamic viscosity of the silicone composition (X) as measured according to DIN53019 is between 100 mPa·s and 100 Pa·s, and wherein the silicone composition contains reinforcing filler having a BET surface area ≥50 m²/g.

2. The method of claim 1, wherein the dynamic viscosity of the silicone composition (X) is between 200 mPa·s and 75 Pa·s.

3. The method of claim 1, wherein the dynamic viscosity of the silicone composition (X) is between 300 mPa·s and 50 Pa·s.

4. The method of claim 1, wherein a distance of the slot die from the carrier in step i) is at least 2 μm greater than the layer thickness of the silicone film produced.

5. The method of claim 1, wherein the thickness precision is not more than ±3%.

6. The method of claim 5, wherein the film thickness is from 2 to 100 μm.

7. The method of claim 1, wherein the film thickness is from 2 to 100 μm.

8. The method of claim 1, wherein the film thickness is from 0.5 μm to 50 μm.

9. The method of claim 1, wherein the maximum diameter of particles in the reinforcing filler is less than or equal to one third the film thickness.

10. The method of claim 1, wherein the method takes place in a clean room of class ISO 4 or better.

11. The method of claim 1, wherein the carrier has a smooth surface characterized by the absence of depressions or elevations which are greater than ±5% of the film thickness.

12. The method of claim 1, wherein the carrier has a smooth surface characterized by the absence of depressions or elevations which are greater than ±3% of the film thickness.

13. The method of claim 1, further comprising pretreating the carrier with a release coating which facilitates release of the thin silicone film from the carrier.

14. The method of claim 13, further comprising polishing the surface of the pretreated carrier by contact with a polishing roll prior to applying the crosslinkable silicone composition.

15. The method of claim 1, further comprising parting the thin silicone film from the carrier.

16. The method of claim 15, further comprising transferring a parted silicone film to another carrier.

17. The method of claim 1, wherein the crosslinkable silicone composition is a moisture curing RTV-2 composition.

18. The method of claim 1, wherein an organic solvent is present.

19. The method of claim 18, wherein the organic solvent is present in an amount of from 1 to 50 weight percent based on the total weight of the coating composition.

20. The method of claim 1, wherein the reinforcing filler particles are hydrophobicized by surface treatment.

* * * * *